United States Patent [19]
Matsuyama

[11] Patent Number: 5,448,064
[45] Date of Patent: Sep. 5, 1995

[54] SCANNING ELECTRON MICROSCOPE

[75] Inventor: Hideo Matsuyama, Saitama, Japan

[73] Assignee: Hitachi, Ltd., Tokyo, Japan

[21] Appl. No.: 247,890

[22] Filed: May 23, 1994

[30] Foreign Application Priority Data

May 27, 1993 [JP] Japan .................. 5-125706

[51] Int. Cl.⁶ ............................................ H01J 37/09
[52] U.S. Cl. ....................... 250/310; 250/396 ML; 250/397
[58] Field of Search ........... 250/310, 392, 398, 396 R, 250/396 ML, 305

[56] References Cited

U.S. PATENT DOCUMENTS 5,185,530 2/1993 Norioka et al. .................. 250/310

FOREIGN PATENT DOCUMENTS 61-225971 10/1986 Japan .
62-39974 2/1987 Japan .

OTHER PUBLICATIONS

Japanese Journal of Applied Physics vol. 22, No. 8, Aug. (1983) pp. 1332–1334.

Primary Examiner—Paul M. Dzierzynski
Assistant Examiner—Kiet T. Nguyen
Attorney, Agent, or Firm—Antonelli, Terry, Stout & Kraus

[57] ABSTRACT

A device for reducing the magnetic field, leaked from an electromagnetic lens, in the sample position of a scanning electron microscope, a sample is mounted on a sample cassette which is made of a material having high magnetic permeability, and a head portion of an electron optical system which is made of a material having high magnetic permeability is arranged on the sample side. A window for passing a probe beam therethrough is provided in a wall surface of the electron optical system. Both the sample cassette and the electron optical system head portion surround the sample to constitute a magnetic shield.

13 Claims, 5 Drawing Sheets

SCANNING ELECTRON MICROSCOPE

BACKGROUND OF THE INVENTION

The present invention relates to a scanning electron microscope, for example, a scanning electron microscope which is designed in such a way that a condensed probe beam is applied to a surface of a sample held by sample holding means, and the secondary electrons emitted from the sample are collected through an electron optical system to detect the spin polarization of each of the secondary electrons, and more particularly to a scanning electron microscope which is suitable for the case where the orbits of the secondary electron are readily influenced due to the floating magnetic field and the like working on the position where the sample is mounted.

Heretofore, in a scanning electron microscope and the like, for the purpose of reducing the influence of the working floating magnetic field upon a probe beam and/or the orbits of the secondary electrons, a magnetic shield which is made of a material having high magnetic permeability is arranged on an internal surface of a sample chamber, or alternatively the sample chamber itself is made of a material having high magnetic permeability. For example, the Mott detector which is introduced in FIG. 1 of an article entitled "SPIN POLARIZATION DUE TO LOW-ENERGY ELECTRON DIFFRACTION AT THE W(001) SURFACE" by Koike et al. (Japanese Journal of Applied Physics, Vol. 22, No. 8, August, 1983 pp. 1332 to 1334) is an example of the former.

SUMMARY OF THE INVENTION

However, in the case where an electromagnetic lens was used as the means for condensing a probe beam of the scanning electron microscope, the electromagnetic lens was arranged in the vicinity of the position where a sample is mounted. Therefore, even when the magnetic shield which was made of a material having high magnetic permeability was arranged on the internal surface of the sample chamber, or alternatively the sample chamber was made of the material having high magnetic permeability, the magnetic field leaked from the electromagnetic lens was applied to the position where the sample was mounted. In the scanning electron microscope, since the secondary electron just after being emitted from the sample has the low energy, the orbit of the secondary electron was forced to be largely polarized due to the leaked magnetic field. As a result, it was difficult to introduce the secondary electrons into the means for detecting a spin. In addition, a spin polarization vector of the secondary electron performed the precession with the direction of the leaked magnetic field as an axis. Therefore, the rotation of the spin polarization vector due to the precession resulted in a measurement error of the above-mentioned spin detecting means.

It is therefore an object of the present invention to provide a scanning electron microscope in which the magnetic field leaked out from the electromagnetic lens, the floating magnetic field and the like are capable of being reduced in the position where the sample is mounted as much as possible.

In order to attain the above-mentioned object, the scanning electron microscope according to the present invention may provide that one or both of a head portion of an electron optical system and a sample holding portion is/are made of a material having high magnetic permeability and is/are arranged so as to surround a sample, and a magnetic shield is constituted by one or both of the head portion of the electron optical system and the sample holding portion. Alternatively, the head portion of the electron optical system and the sample holding portion constitute the magnetic shield integrally with each other. That is, the floating magnetic field and the like which may work on the sample are shielded by the magnetic shield. But, windows are formed through portions of the magnetic shield, for example, the head portion of the electron optical system, through which a probe beam and the secondary electrons are to be passed, respectively, so that the probe beam can be applied to the surface of the sample and also the secondary electrons can be collected.

This magnetic shield is made of a material having high magnetic permeability, whereby almost all the magnetic field near the sample is substantially shielded by the magnetic shield. As a result, the magnetic field in the sample position can be reduced down to the degree in which the orbits of the secondary electrons, and the like are hardly influenced thereby. But, in the magnetic shield, there is provided the windows for passing respectively the probe beam and the secondary electrons therethrough. Although the provision of the windows actually reduces the magnetic shielding effect, if the size of each of the window is made sufficiently small as compared with that of the sample or a distance between the windows, the reduction of the magnetic shielding effect can be almost ignored.

DESCRIPTION OF THE PREFERRED EMBODIMENTS

Figure 1:
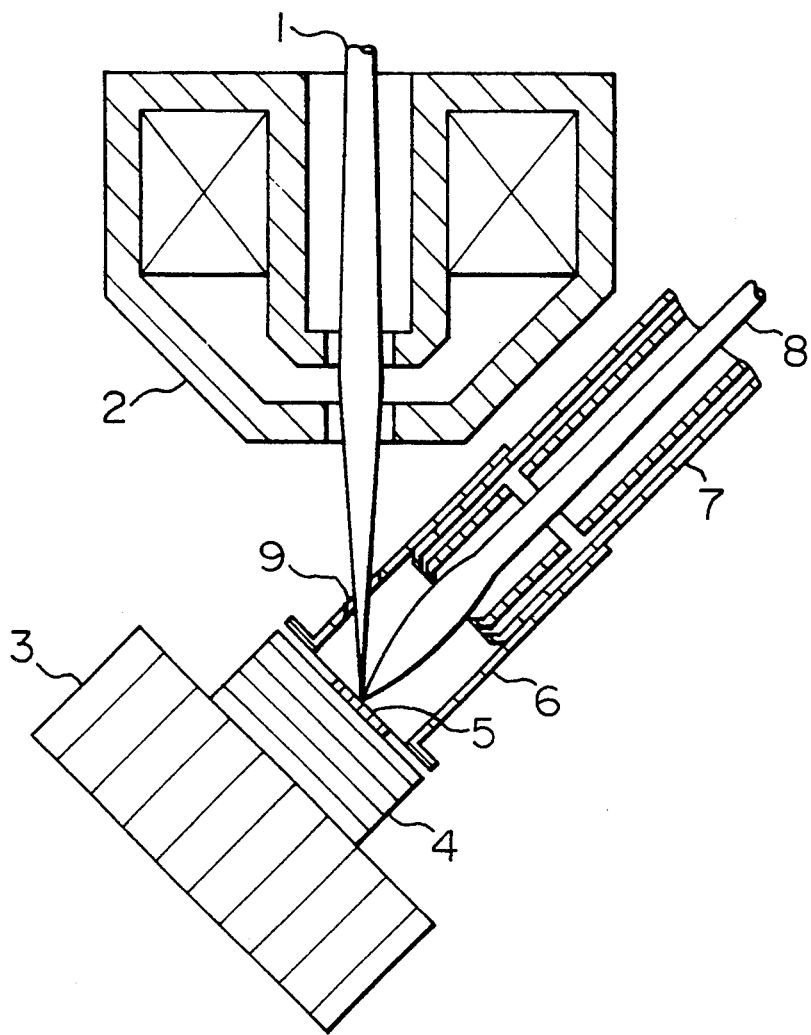
FIG. 1 is a cross sectional view showing a construction round a sample of a scanning electron microscope according to an embodiment of the present invention.

An embodiment of the present invention will hereinafter be described with reference to FIG. 1 as a cross sectional view showing a construction round a sample. A probe beam 1 which has been applied from a system for applying the probe beam is focused on a surface of a sample 5 by an electromagnetic lens 2. The secondary electrons 8 which have been emitted from the sample 5 are accelerated and collected through an electron optical system 7 to be introduced into means for detecting a spin (not shown) followed by the electron optical system 7. In this connection, the sample 5 is mounted on a sample cassette 4 which is made of a material having high magnetic permeability such as permalloy or pure iron, and the sample cassette 4 is mounted on a sample stage 3. In addition, on the sample side of the electron optical system 7, a head portion 6 of the electron optical system 7 which is made of the material having high magnetic permeability such as permalloy or pure iron is arranged so as to be in contact with the sample cassette 4 or to leave a small gap thereto. The head portion 6 of the electron optical system has a cylindrical shape, and in order to pass the probe beam 1 therethrough, a window 9 is provided in the wall thereof. Both the sample cassette 4 and the head portion 6 of the electron optical system surround the sample 5 to constitute a magnetic shield. Since the gap between the sample cassette 4 and the head portion 6 of the electron optical system is very small, the magnetic field is shielded by the magnetic shield without entering into a space near the sample 5. Now, for the purpose of reducing the entrance of the magnetic field from the above-mentioned gap, the area of the end, facing the sample cassette 4, of the head portion 6 of the electron optical system is made large. The influence of the magnetic field which enters from the window 9 upon the vicinity of the sample can be reduced by making the size of the window 9 sufficiently small. On the other hand, the influence of the magnetic field which enters from the open end, on the electron optical system 7 side, of the head portion 6 of the electron optical system upon the vicinity of the sample can be reduced by making the distance between the sample 5 and the open end sufficiently large. In addition, while the secondary electrons are passed through the vicinity of the open end on the electron optical system 7 side, since in that portion, the secondary electrons are accelerated through the electron optical system 7, the influence of the magnetic field thereupon can be ignored.

As described above, the magnetic field leaked out from the electromagnetic lens and the like can be substantially reduced in the position where the sample is mounted. At this time, the movement of the sample 5 in the direction parallel to the sample surface can be performed as long as the sample 5 and the internal surface of the head portion 6 of the electron optical system do not come in content with each other. The movement in the direction perpendicular to the sample surface can be performed by adding a normal movement mechanism, which moves in conjunction with the sample cassette 4, to the head portion 6 of the electron optical system. In addition, with respect to the exchange of the sample, only the sample cassette 4 on which the sample 5 is mounted may be exchanged for another sample cassette on which another sample is mounted through both a sample chamber and a pre-exhaust chamber, and thus there is no need of opening the whole sample chamber to the atmosphere. Those operations can be readily realized as the application of the technology employed in the manufacture of the normal scanning electron microscope, and therefore, the description thereof will be omitted here for the sake of simplicity.

Figure 2:
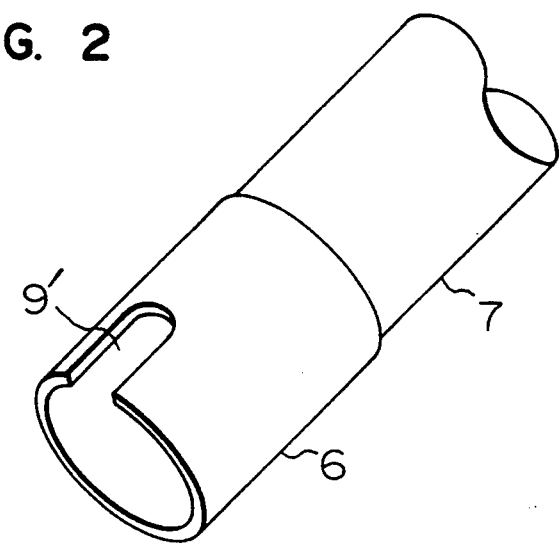
FIG. 2 is a perspective view showing a structure of a portion of an example of a modification of the scanning electron microscope shown in FIG. 1.

FIG. 2 is a perspective view showing a structure of another embodiment of the head portion 6 of the electron optical system. But, the illustration of the probe beam 1, the electromagnetic lens 2 and the secondary electrons 8 is omitted in the figure. Unlike the above-mentioned embodiment shown in FIG. 1, in the present embodiment, the window 9 is made extend to the end of the head portion 6, and also the flange portion of the periphery of the end is omitted. In the scanning electron microscope, during observation of the sample, the fixed area of the sample is successively scanned. In this connection, the scanning operation is performed by deflecting the probe beam from a viewpoint of simplification of the scanning operation. In the high magnification observation, since the deflecting width of the probe beam 1 is small, even the window 9 of the above-mentioned embodiment shown in FIG. 1 can cope sufficiently therewith. On the other hand, in the low magnification observation, the probe beam 1 is blocked off by the window 9, and as a result, it will be impossible to observe the sufficiently large area of the sample. In FIG. 2, by taking this respect into consideration, in order to enable the sufficiently wide observation to be performed without impediment to the magnetic shielding effect, the window is provided in the form of a rectangular cut.

Figure 3:
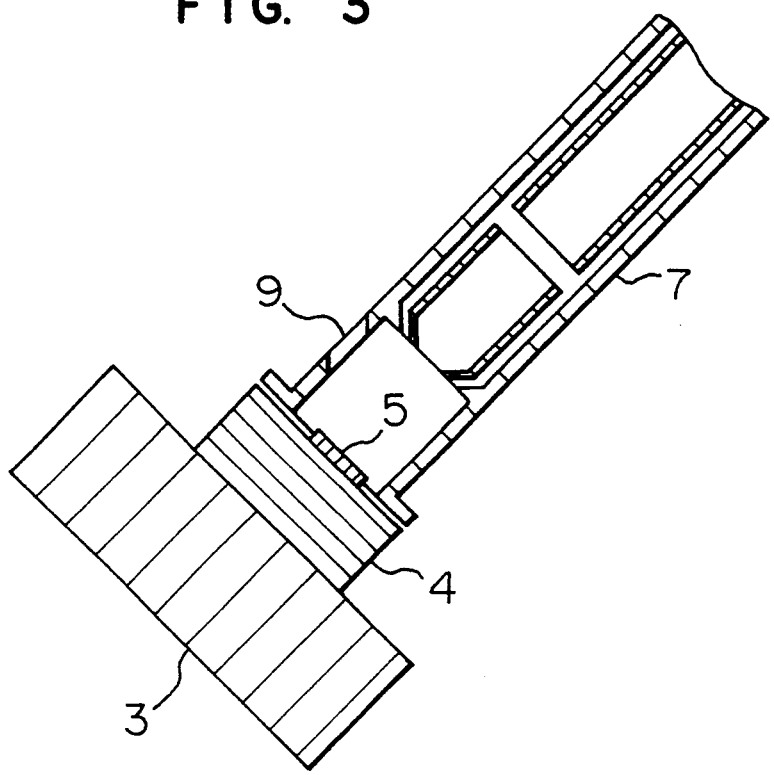
FIG. 3 is a cross sectional view showing a construction round a sample of a scanning electron microscope according to another embodiment of the present invention.
Figure 4:
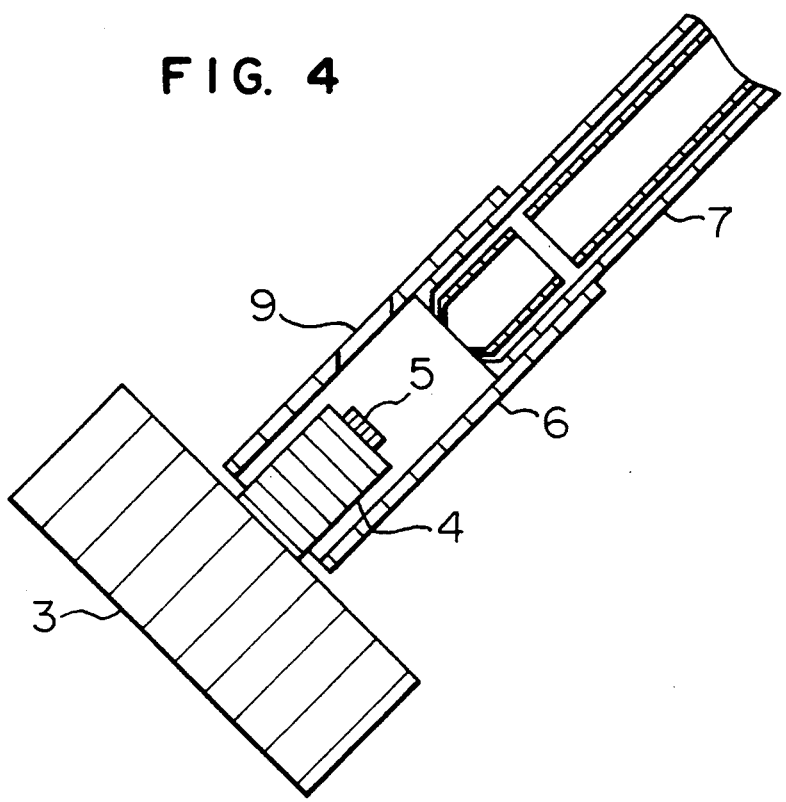
FIG. 4 is a cross sectional view showing a construction round a sample of a scanning electron microscope according to still another embodiment of the present invention.
Figure 5:
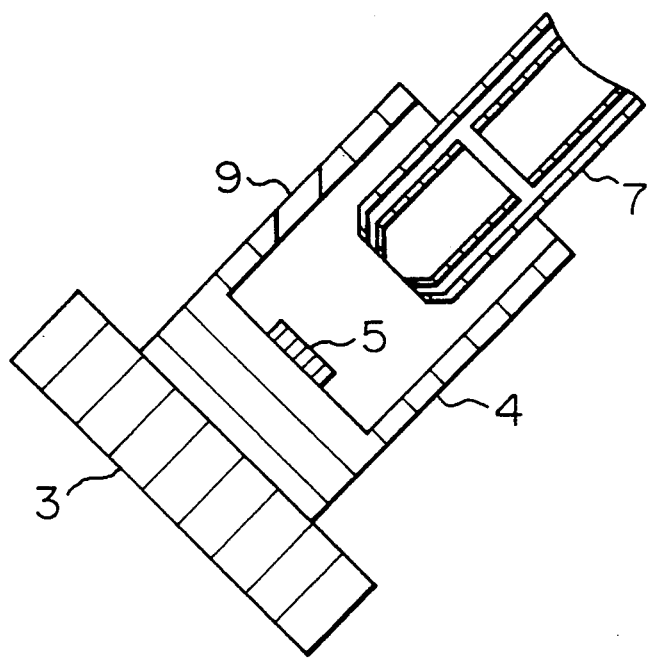
FIG. 5 is a cross sectional view showing a construction round a sample of a scanning electron microscope according to yet another embodiment of the present invention.

Another embodiment, still another embodiment and yet embodiment are shown in FIGS. 3, 4 and 5, respectively. In those cases as well, the illustration of the probe beam 1, the electromagnetic lens 2 and the secondary electrons 8 are omitted for the sake of simplicity.

The embodiment shown in FIG. 3 is designed in such a way that the peripheral portion 7 of the electron optical system and the electron optical system head portion 6 which are shown in FIG. 1 are integrated with each other to provide the integral one-piece electron optical system 7 and are made of a material having high magnetic permeability.

The embodiment shown in FIG. 4 is designed in such a way that the sample cassette 4 is made of a non-magnetic material and only the electron optical system head portion 6 is made of a material having high magnetic permeability. In this case, since the magnetic field will enter from the sample side open end of the electron optical system head portion 6, the sample cassette 4 made of a non-magnetic material is sufficiently inserted from the open end towards the electron optical system 7 side so that the influence of the leaked magnetic field upon the vicinity of the sample 5 is made small as much as possible.

The embodiment shown in FIG. 5 is designed in such a way that the electron optical system head portion 6 is omitted, and the sample cassette 4 made of a material having high magnetic permeability is substituted therefor. In this case, since the magnetic field will enter from the head portion of the electron optical system 7, the peripheral portion of the sample cassette 4 is formed long so as for the electron optical system 7 to be able to be sufficiently inserted thereinto, so that the influence of the leaked magnetic field upon the vicinity of the sample 5 is made small as much as possible. It is, of course, understood that the window 9 for passing the probe beam 1 therethrough is provided in the peripheral upstanding cylindrical portion of the sample cassette 4.

Figure 6:
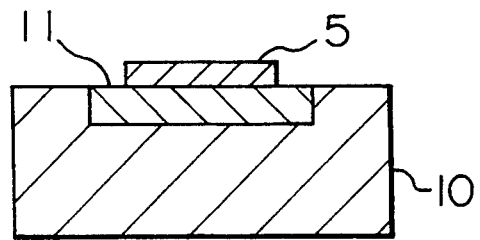
FIG. 6 is a cross sectional view showing a structure of a sample cassette of a scanning electron microscope according to a further embodiment of the present invention.

In the case where the sample cassette 4 is made of a material having high magnetic permeability, if the sample 5 is a ferromagnetic material, a part of the magnetic field in the sample cassette 4 will enter necessarily towards the sample side. An embodiment of the sample cassette for preventing this harmful phenomenon is shown in FIG. 6. In this case, the sample cassette 4 is constituted by both a sample cassette body 10 made of a material having high magnetic permeability and a sample cassette plate 11 made of a non-magnetic material such as copper, aluminium or stainless steel. The sample 5 is mounted on the sample cassette plate 11. Since the non-magnetic material having low magnetic permeability is provided between the sample 5 and the sample cassette body 10, the magnetic field in the sample cassette body 10 is hardly leaked out.

Figure 7:
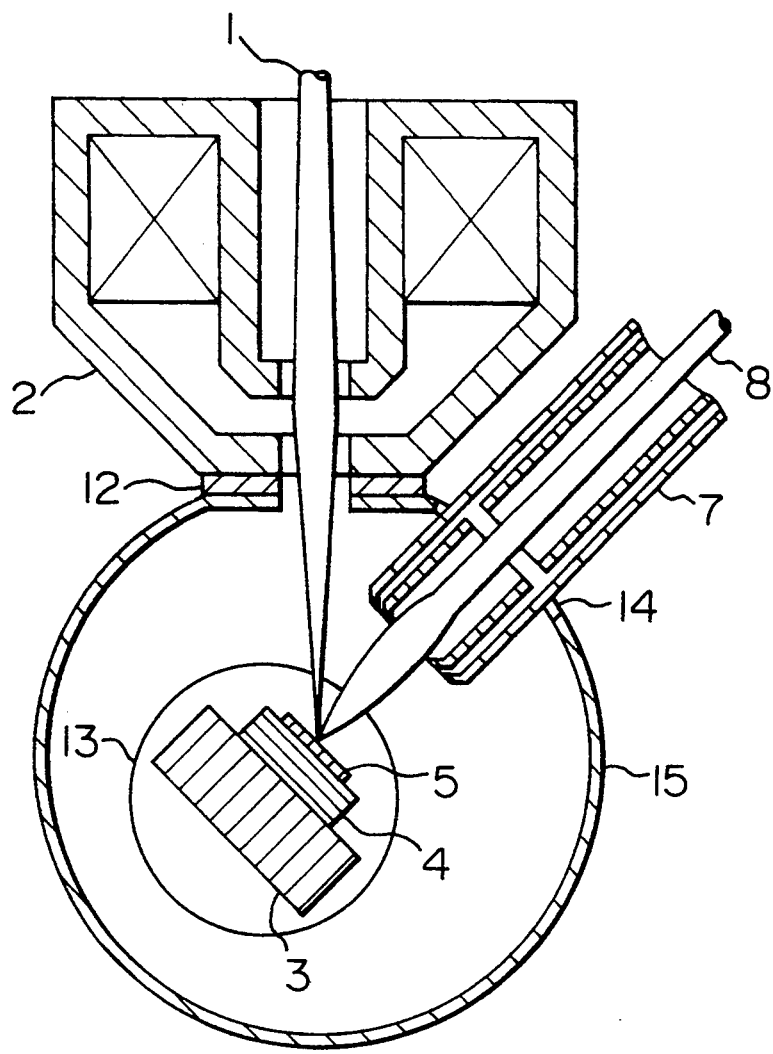
FIG. 7 is a cross sectional view showing a construction round a sample of a scanning electron microscope according to an even further embodiment of the present invention.

FIG. 7 shows a construction of another embodiment of the present invention. The above-mentioned embodiments which have been shown in FIGS. 1 to 6, respectively, are designed so as to prevent the magnetic field from being leaked towards the sample in the periphery of the sample, whereas the present embodiment is designed so as to shield magnetically the sample cassette 4 and the whole head portion of the electron optical system 7. In the present embodiment shown in FIG. 7, a spheroidal magnetic shield 15 which is made of a material having high magnetic permeability is provided in the head portion of the electromagnetic lens 2 through a non-magnetic spacer 12. A window 13 for insertion of the sample stage and a window 14 for insertion of the electron optical system are respectively provided in the magnetic shield 15 so that the sample stage 3 and the electron optical system 7 can be arranged therein so as to have the positional relationship as shown in the figure. In the present embodiment, since the electromagnetic lens 2 and the magnetic shield 15 are coupled to each other through the non-magnetic spacer 12, the magnetic field due to the electromagnetic lens 2 does not enter into the magnetic shield 15, and the influence of the magnetism of the floating magnetic field upon the periphery of the sample can be substantially perfectly removed.

Figure 8:
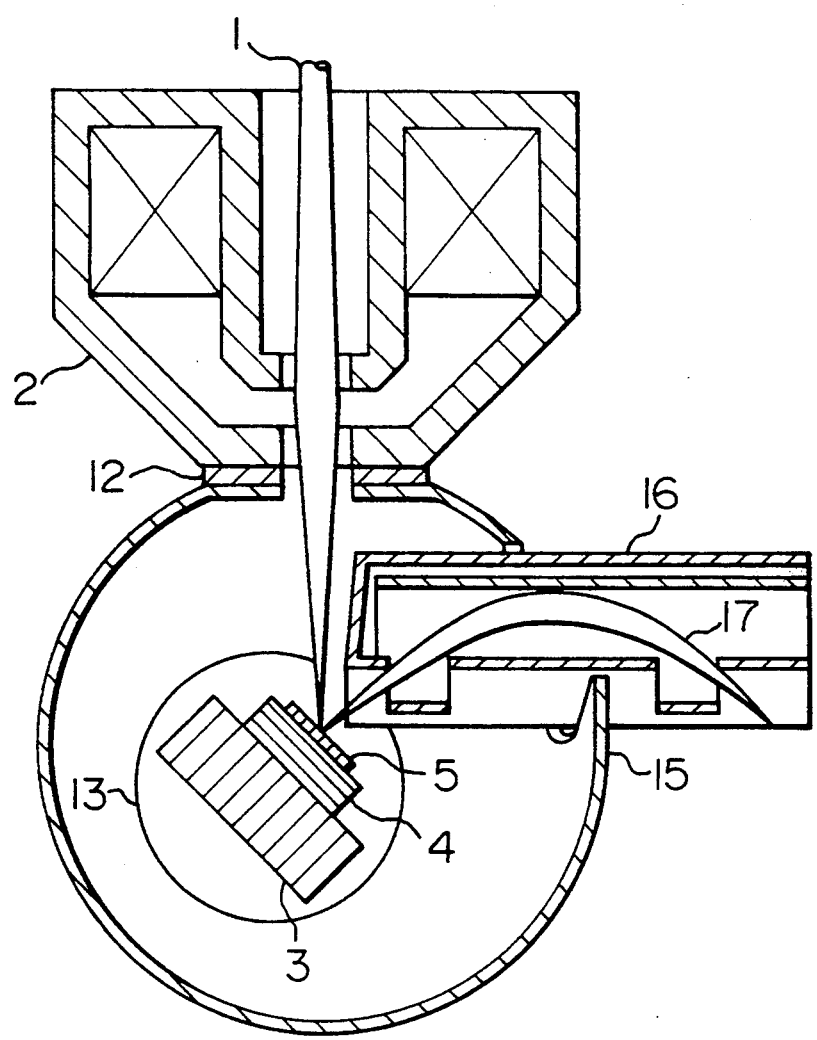
FIG. 8 is a cross sectional view showing a construction round a sample according to an embodiment in the case where the present invention is applied to a scanning electron microscope which operates to perform the measurement of the Auger electrons.

Although the description of the above-mentioned embodiments has been limited to the scanning electron microscope of a type in which the spin of the secondary electron is detected, the desired effects can be obtained in the case as well where the present invention is, for example, applied to a scanning electron microscope which operates to analyze the Auger electrons. FIG. 8 shows a construction round the sample holding means of an example of the arrangement thereof.

As can be seen as compared with the embodiment shown in FIG. 7, the present embodiment shown in FIG. 8 employs, instead of the electron optical system 7 for detecting the secondary electrons, an energy analyzer 16, e,g., a cylindrical mirror analyzer in the example of the figure. In the present embodiment, out of the electrons which have been emitted from the sample 5 by applying the probe beam 1 to the sample 5, the electrons which have been caught by the cylindrical mirror analyzer 16 are analyzed.

It is to be understood that the analysis of the Auger electrons can be implemented in the same manner as that in the embodiments shown in FIGS. 1 to 6 without being limited to this embodiment.

As set forth hereinabove, according to the present embodiments, the magnetic field leaked out from the electromagnetic lens, the floating magnetic field and the like can be reduced in the position where the sample is mounted as much as possible, and the secondary electrons can be transmitted to the spin detecting means without any loss. Therefore, there is provided the effect that the reduction of the efficiency of the spin detecting means can be effectively prevented. In addition, since the precession of the spin polarization vector of the secondary electron due to the leaked magnetic field and the like can be largely reduced, there is provided the effect that the occurrence of the detection error of the spin detecting means can be effectively prevented.

I claim:

1. A scanning electron microscope including means for holding a sample, means for applying a probe beam to said sample, means for condensing said probe beam, and means for collecting electrons emitted from said sample by application of said probe beam to said sample and for detecting the physical quantities which said electrons have,
    wherein one or both of said electron collecting means and a peripheral portion of said sample is/are shielded by a material having high magnetic permeability, and a hole for passing said probe beam therethrough is provided in a portion of said high-magnetic permeability material through which said probe beam is to be passed.

2. A scanning electron microscope including means for holding a sample, means for applying a probe beam to said sample, means for condensing said probe beam, and an electron optical system for collecting secondary electrons emitted from said sample by application of said probe beam to said sample and for introducing said secondary electrons into means for detecting a spin polarization of said secondary electrons,
    wherein one or both of a head portion of said electron optical system and a peripheral portion of said sample is/are made of a material having high magnetic permeability, and a portion for passing said probe beam therethrough is provided in the head portion of said electron optical system.

3. A scanning electron microscope according to claim 2, wherein said portion for passing said probe beam therethrough is provided in the form of a rectangular cut extending up to said head portion of said electron optical system.

4. A scanning electron microscope according to claim 2, wherein a part of said peripheral portion of said sample is made of a non-magnetic material, and said part is inserted into the inside of said head portion of said electron optical system.

5. A scanning electron microscope according to claim 2, wherein said peripheral portion of said sample is made of a material having high magnetic permeability, and said head portion of said electron optical system is inserted into the inside of said means for holding said sample.

6. A scanning electron microscope according to claim 2, wherein said peripheral portion of said sample is made of a material having high magnetic permeability, and said sample is arranged on a part of a peripheral portion which is made of a non-magnetic material.

7. A scanning electron microscope including means for holding a sample, means for applying a probe beam to said sample, means for condensing said probe beam, and an electron optical system for collecting secondary electrons emitted from said sample by application of said probe beam to said sample and for introducing said secondary electrons into means for detecting a spin polarization of said secondary electrons, wherein said means for condensing said probe beam is an electromagnetic lens, and both said means for holding said sample and a head portion of said electron optical system are arranged within a spheroidal magnetic shield which is provided in one end of said electromagnetic lens through a non-magnetic spacer.

8. A scanning electron microscope including means for holding a sample, means for applying a probe beam to said sample, means for condensing said probe beam, and means for analyzing electrons emitted from said sample by application of said probe beam to said sample, wherein one or both of a head portion of said means for analyzing said electrons and a peripheral portion of said sample is/are made of a material having high magnetic permeability, and a portion for passing said probe beam therethrough is provided in said head portion of said means for analyzing said electrons.

9. A scanning electron microscope according to claim 8, wherein said portion for passing said probe beam therethrough is provided in the form of a rectangular cut extending up to said head portion of said electron optical system.

10. A scanning electron microscope according to claim 8, wherein a part of said peripheral portion of said sample is made of a non-magnetic material, and said part is inserted into the inside of said head portion of said electron optical system.

11. A scanning electron microscope according to claim 8, wherein said peripheral portion of said sample is made of a material having high magnetic permeability, and said head portion of said electron optical system is inserted into the inside of said means for holding said sample.

12. A scanning electron microscope according to claim 8, wherein said peripheral portion of said sample is made of a material having high magnetic permeability, and said sample is arranged on a part of a peripheral portion which is made of a non-magnetic material.

13. A scanning electron microscope including means for holding a sample, means for applying a probe beam to said sample, means for condensing said probe beam, and means for analyzing Auger electrons emitted from said sample by application of said probe beam to said sample, wherein said means for condensing said probe beam is an electromagnetic lens, and both said means for holding said sample and means for collecting said Auger electrons and for detecting the physical quantities of said Auger electrons are arranged within a spheroidal magnetic shield which is provided in one end of said electromagnetic lens through a non-magnetic spacer.

* * * * *